(12) United States Patent
Chandhok et al.

(10) Patent No.: US 7,098,466 B2
(45) Date of Patent: Aug. 29, 2006

(54) ADJUSTABLE ILLUMINATION SOURCE

(75) Inventors: Manish Chandhok, Beaverton, OR (US); Eric M. Panning, Hillsboro, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/883,297

(22) Filed: Jun. 30, 2004

(65) Prior Publication Data

US 2006/0002113 A1 Jan. 5, 2006

(51) Int. Cl.
*G01B 9/02* (2006.01)

(52) U.S. Cl. .................. 250/492.2; 250/504 R

(58) Field of Classification Search ............ 250/492.2, 250/504 R; 356/237.4; 362/257
See application file for complete search history.

(56) References Cited

U.S. PATENT DOCUMENTS 4,669,884 A * 6/1987 Bigelow et al. ............ 356/401

OTHER PUBLICATIONS

Hutcheson, G., "The First Nanochips," *Scientific American*, Apr. 2004, pp. 76-83.
Stix, G., "Getting More from Moore's," Scientific American.com, Apr. 17, 2001, 6 pgs.

* cited by examiner

*Primary Examiner*—Kiet T. Nguyen
(74) *Attorney, Agent, or Firm*—George Chen

(57) ABSTRACT

According to an embodiment of the invention, an adjustable EUV light source may be used for photolithography. The EUV light source, such as an electrode, is mounted in an adjustable housing. The housing can be adjusted to change the distance between the light source and focusing mirrors, which in turn changes the partial coherence value of the system. The partial coherence value can be changed to print different types of semiconductor features.

20 Claims, 6 Drawing Sheets

202

300

300

500

ADJUSTABLE ILLUMINATION SOURCE

FIELD OF THE INVENTION

The present invention generally relates to semiconductor processing, and specifically to adjustable light sources for extreme ultraviolet (EUV) photolithography.

BACKGROUND

Integrated Circuits (ICs) generally comprise many semiconductor features, such as transistors, formed on a semiconductor substrate. The patterns used to form the devices may be defined using a process known as photolithography. Using photolithography, light is shone through a pattern on a mask, transferring the pattern to a layer of photoresist on the semiconductor substrate. The photoresist can then be developed, removing the exposed photoresist and leaving the pattern on the substrate. Various other techniques, such as ion implantation, etching, etc. can then be performed to the exposed portion of the substrate to form the individual devices.

To increase the speed of ICs such as microprocessors, more and more transistors are added to the ICs. Therefore, the size of the individual devices must be reduced. One way to reduce the size of individual features is to use short wavelength light during the photolithography process. According to Raleigh's Law ($R = k \cdot \lambda / NA$, where k is a constant, and NA=Numerical Aperture, and R is the resolution of features), a reduction in the wavelength of the light proportionately reduces the size of printed features.

Extreme ultraviolet (EUV) light (13.5 nm) is now being used to print very small semiconductor features. For example, EUV can be used to print isolated features that are 15–20 nanometers (nm) in length, and nested features and group structures that have 50 nm lines and spaces. EUV lithography is targeted to meet the requirements of a 50 nm half-pitch, where pitch is equal to line plus feature size. Since EUV light has such a short wavelength, it is easily absorbed, even by air. Therefore, EUV photolithography is performed in a vacuum using multilayer-coated reflective optics.

EUV photons can be generated by the excited the atoms of a plasma. One way to generate the plasma is to project a laser beam on to a target (droplet, filament jet) creating a highly dense plasma. When the excited atoms of the plasma return to a stable state, photons of a certain energy, and thereby a certain wavelength, are emitted. The target may be, for example, Xenon, Tin, or Lithium. Another way to produce EUV photons is to create a pinch plasma between two electrodes with the target material in a gaseous form between the two electrodes, thereby exciting the atoms.

When very coherent light is used with EUV optics, there tends to be significant ringing in the diffraction order. As a result, partially coherent light is used for EUV lithography. The partial coherence of photolithography system is defined by $NA_{ill}/NA_{pro}$, where $NA_{ill}$ is the numerical aperture on the illumination side of the optics, and $NA_{pro}$ is the numerical aperture on the projection side of the optics. The numerical aperture is the size of the orifice through which light passes. A measure of partial coherence is often referred to as a "sigma" or "σ" value.

Different partial coherence values may be used for different types of features. For example, for printing isolated lines, is advantageous to use smaller partial coherence values. For tighter pitches (denser printing), higher partial coherence values result in increased resolution. Therefore, adjustable apertures have been used with standard wavelength lithography to adjust the partial coherence of the light. These adjustable apertures may be zoomable lenses or mirrors. However, zoom lenses for reflective optics are extremely complex and very lossy due to multiple reflections (for example, at each bounce, 30% of the light may be lost).

Typically, when zoomable mirrors are not present, a user begins with one set partial coherence value. The numerical aperture on the illumination side is designed to be as large as possible, and then the aperture on the illumination side is stepped down to change the numerical aperture on the illumination side. While this technique gives a wide range of partial coherence values, it significantly reduces the intensity of transmitted light.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein is an Adjustable Illumination Source. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to an embodiment of the invention, an adjustable housing for an EUV photolithography system is created. An electrode for generating EUV photons is mounted on the adjustable housing. The housing can be adjusted so that the electrode can be moved toward and away from the EUV mirrors to change the effective partial coherence of the system. According to one embodiment of the invention, an electrode enclosing a plasma to generate EUV photons is mounted on a housing which includes a bellows to allow adjustment of the position of the electrode. The distance between the source plasma and the mirrors is thereby adjustable, allowing the user to change the partial coherence by changing the distance between the source of the light and the reflecting mirrors.

Figure 1:
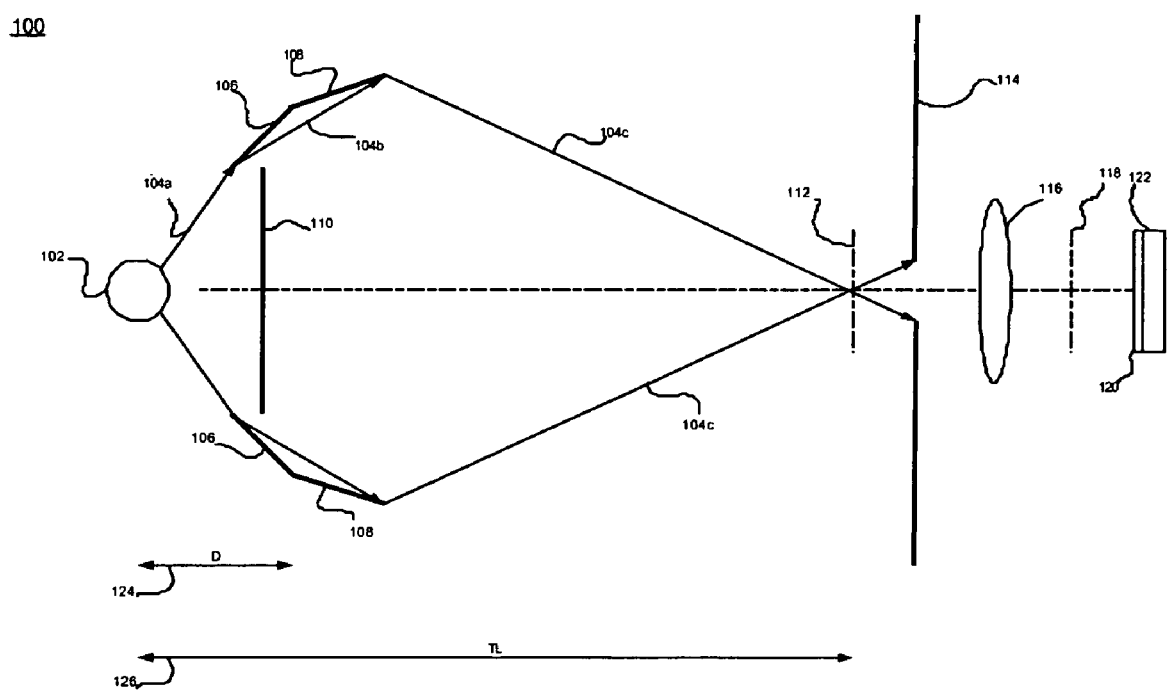
FIG. 1 is a side view of a system for performing photolithography using EUV light according to an embodiment of the invention.

FIG. 1 illustrates a system 100 for performing photolithography using EUV light. Since EUV light is easily absorbed, mirrors are used to focus the light rather than lenses. An adjustable source plasma 102 emits EUV photons. The source plasma 102 may be a plasma on which a laser is directed, or may be an electrode including a plasma through which an arc is driven. The source plasma 102 includes either the laser or the electrode to excite atoms in the plasma, and when the excited atoms return to a stable state, a photon of a specific wavelength is emitted. For example, the plasma may be a xenon, lithium, or tin plasma emitting 13.5 nanometer (nm) photons. As will be described below, the source plasma 102 is adjustable to allow adjustment of the partial coherence of the system 100.

Light rays 104 are emitted by the source plasma 102. The rays 104 are reflected by mirrors 106 and 108. An obscuration 110 is placed in front of the source plasma 102 to block debris generating by the source plasma 102 and protect the mirrors 106 and 108. The source plasma 102 may generate debris because of Brownian movement. The obscuration 110 may comprise a foil trap to block the debris. The rays 104 are focused at a source image plane 112. A field stop 114 blocks a portion of the rays 104 transmitted to a condenser 116. The condenser 116 may include components to collimate the light, spread the light, or shape the light. A reticle 118 is a mask including a pattern which is projected onto a photoresist layer 120 on a semiconductor substrate 122. The reticle 118 blocks a portion of the rays 104 so that only the desired areas of the photoresist layer 120 are exposed.

According to an embodiment of the invention, the position of the source plasma 102 is adjustable. A distance 'D' 124 between the source plasma 102 and the junction of the mirrors 106 and 108 can be adjusted to change the partial coherence of the system. The partial coherence of the system can be determined using the equations described below. A track length 'TL' 126 is the distance between the source plasma 102 and the source image plane 112.

The magnification of the system can be determined using Equation 1:

$$M_w = \frac{TL}{D} - 1 \qquad \text{Equation 1}$$

where $M_w$ is the magnification of the system, TL is the track length 126 between the source plasma 102 and the source image plane 112, and D is the distance 124 between the source plasma 102 and the junction of the mirrors 106 and 108.

The partial coherence ($\sigma$) of the system is determined by dividing the numerical aperture of the object side of the optics ($NA_O$) by the numerical aperture of the image side of the optics ($NA_I$), as shown in Equation 2:

$$\sigma = \frac{NA_O}{NA_I} \qquad \text{Equation 2}$$

The numerical aperture on the object side ($NA_O$) may be expressed by dividing the numerical aperture of the collector ($NA_{collector}$) by the product of the reduction ratio of the projection optics by the magnification as shown in equation 3:

$$NA_o = \frac{NA_{collector}}{R \times M_w} \qquad \text{Equation 3}$$

The reduction ratio of the optics may be, for example, four times, giving R a value of 0.25.

As a result, the value for the partial coherence, as shown in Equation 4, is the numerical aperture of the collector divided by the product of the numerical aperture of the image side optics times the reduction ratio and the magnification.

$$\sigma = \frac{NA_{collector}}{NA_I \times R \times M_w} \qquad \text{Equation 4}$$

Sample partial coherence values are shown in Table 1. Table 1 includes a typical range of partial coherence values based on typical distances for track lengths and distances between the source and the mirrors:

TABLE 1

| NAimage | NAcollector | Reduction R | TL Track length | D Distance from source | Magnification Mw | Partial coherence |
|---------|-------------|-------------|-----------------|------------------------|------------------|-------------------|
| 0.3 | 0.5 | 0.25 | 3000 | 100 | 29 | 0.23 |
| 0.3 | 0.5 | 0.25 | 3000 | 150 | 19 | 0.35 |
| 0.3 | 0.5 | 0.25 | 3000 | 200 | 14 | 0.48 |
| 0.3 | 0.5 | 0.25 | 3000 | 250 | 11 | 0.61 |
| 0.3 | 0.5 | 0.25 | 3000 | 300 | 9 | 0.74 |

Typical partial coherence values used in photolithography are between 0.4 and 0.8. For example, when printing dense features, a partial coherence of 0.75 may be used. Isolated features may warrant a partial coherence of 0.4 to 0.6. For example, when printing dense features and using a track length of 3 m, if the source is placed 300 mm from the junction of the mirrors 106 and 108, the resulting partial coherence will be 0.74. If printing isolated features, the source can be moved closer to the mirrors, for example to a distance of 150 mm, resulting in a partial coherence value of 0.35.

Figure 2A:
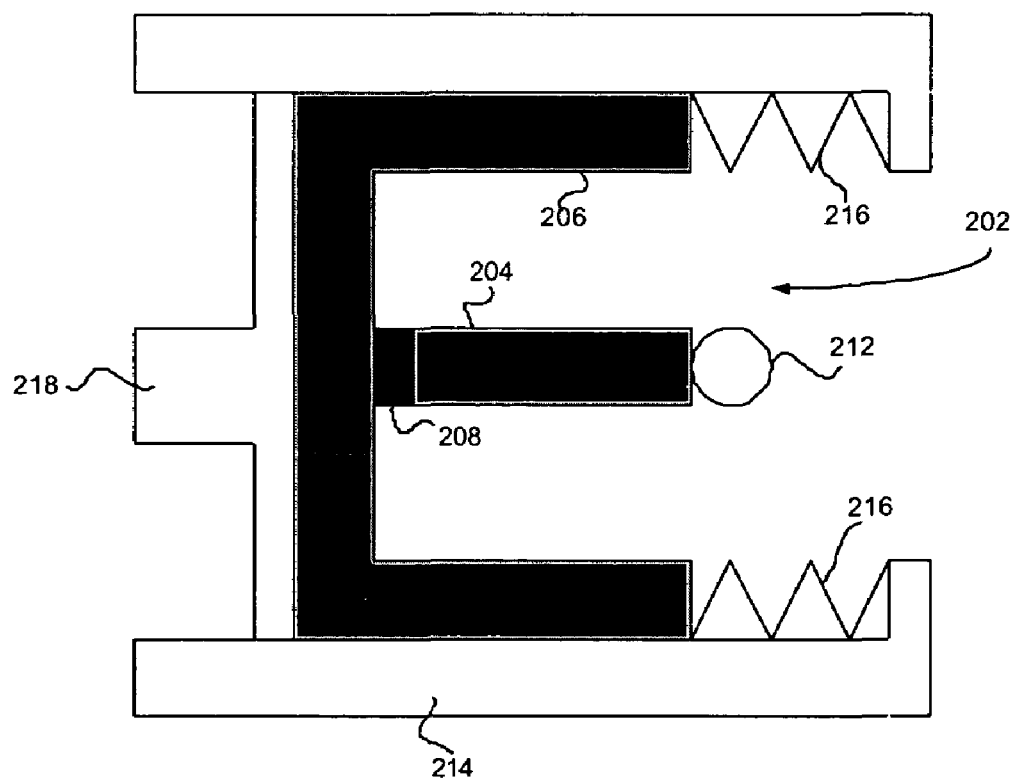
FIG. 2A is a side view of a device for changing the distance between a source and focusing mirrors of the system.
Figure 2B:
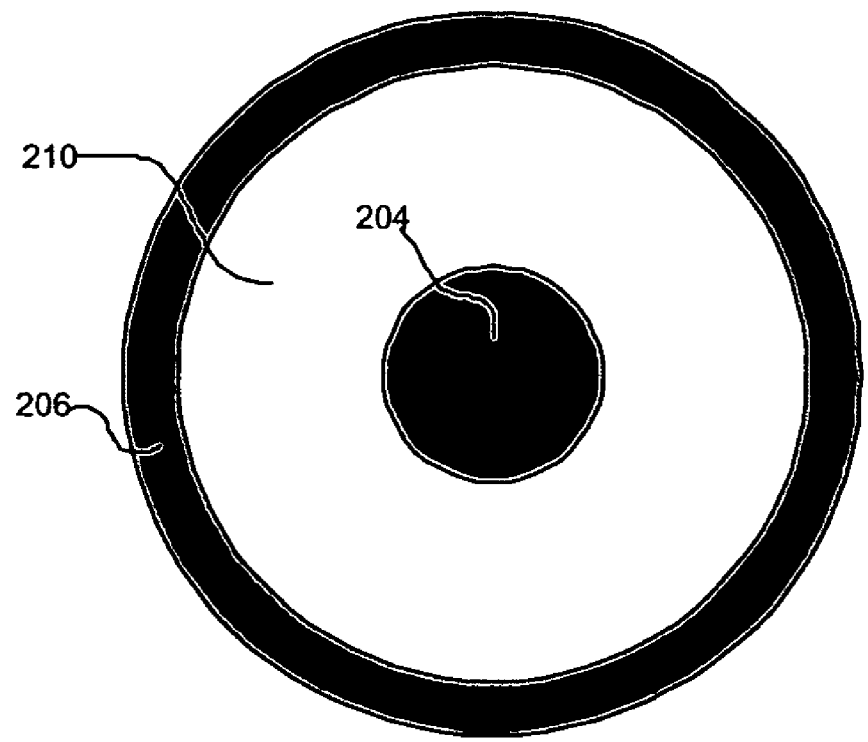
FIG. 2B is an end view of an electrode of the device.

FIG. 2A illustrates a device 200 for changing the distance between the illumination source and the focusing mirrors. The adjustable light source 200 includes an electrode 202 including an anode 204, a cathode 206, and an insulator 208 between the anode 204 and the cathode 206. FIG. 2B illustrates another view of the electrode 202. The view shown in FIG. 2B illustrates that the electrode 202 may be circular in one embodiment. A plasma 210 is located in between the anode 204 and the cathode 206. When an arc is generated between the anode 204 and the cathode 206 the plasma 210 is excited, and emits EUV photons approximately at a source point 212. Although an electrode is described here, it is understood that other devices for generating EUV photons may be used. For example, as previously mentioned, a laser can be used to excite a plasma to generate EUV photons. These other devices may be made so that their distance from the focusing mirrors is adjustable, thereby allowing the partial coherence of the system to be adjustable.

The electrode 202 is mounted to a housing 214 including a bellows 216 and a pushing jig 218. The bellows 216 are attached to the electrode 202, and expand and collapse when the electrode 202 is moved back and forth by the pushing jig 218. The pushing jig 218 may be, for example, a threaded screw device or other mechanical device for positioning the electrode 202 relative to the focusing mirrors. The bellows 216 may produce a spring pressure to hold the electrode 202 against the pushing jig 218 to keep the electrode 202 stable while it is generating EUV photons. Additional components may be added to the housing 214. For example, the housing 214 may incorporate rails or bearings to assist the electrode 202 in moving throughout the housing 214. It is understood that other mechanical components may be used to form the mechanical housing 214, and that they need only be able to physically position the electrode 202 relative to the focusing optics.

Figure 3:
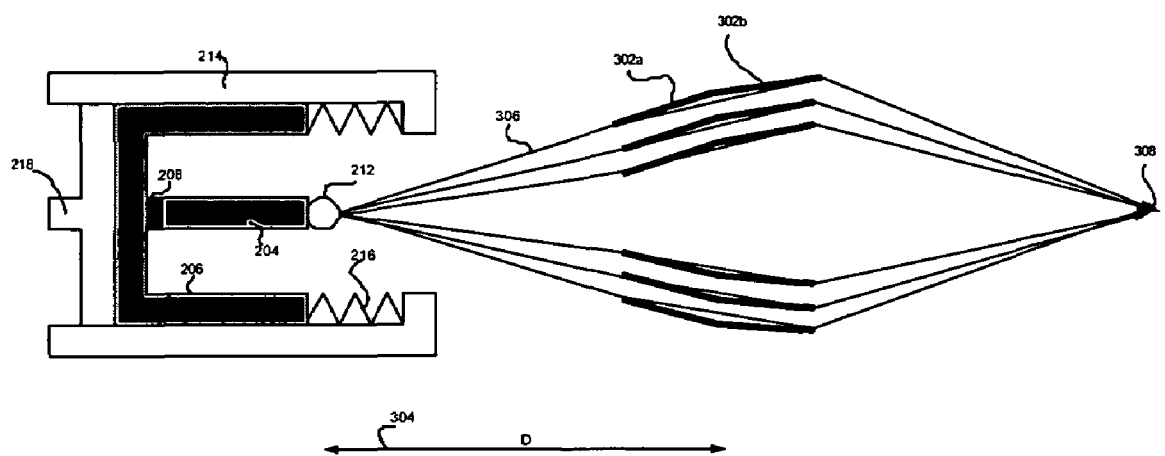
FIG. 3 is a side view of the electrode at one distance from mirrors of the system.
Figure 4:
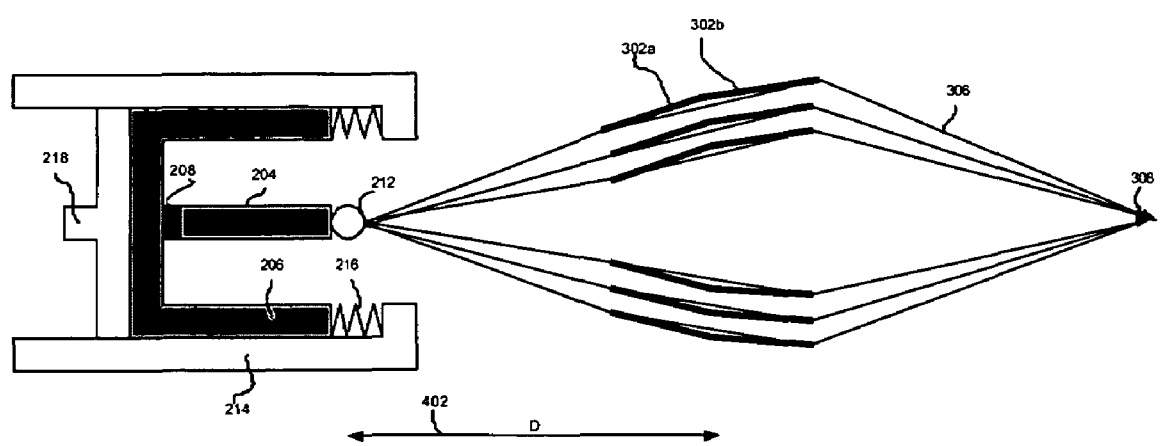
FIG. 4 is a view similar to FIG. 3 with the electrode in a position closer to the mirrors.

FIGS. 3 and 4 illustrate the electrode 202 at different distances from a set of focusing mirrors. FIG. 3 illustrates the electrode 202 further away from a set of mirrors 302, perhaps at a distance D 304 of 300 mm, resulting in a partial coherence value of 0.74 (See table 1). The source plasma 212 emits rays 306 that are collected by the mirrors 302 and focused on a point 308. Since the magnification decreases with the increased distance between the source plasma 212 and the focusing mirrors 302, the partial coherence correspondingly increases. As mentioned above, this position of the electrode 202 may be chosen if a user wishes to print densely packed features. The field stop 114, obscuration 110, condenser 116, reticle 118, and substrate 122 are not shown to not obscure the illustration. It is further understood that any appropriate configuration of optical and lithographic devices may be used.

FIG. 4 illustrates an apparatus 300 having the electrode 202 in a position closer to the focusing mirrors 302. For example, a distance D 402 between the source 212 and the mirror 302 maybe 150 mm, resulting in a partial coherence of 0.35 (See table 1). This may be useful when a user wishes to print isolated features on a semiconductor substrate. As can be seen, the bellows 216 are in a compressed state holding the electrode 202 steady against the pushing jig 218.

In both FIGS. 3 and 4, three concentric shells of mirrors of 302 are shown. However, several more shells, for example five to seven, or more may be used. Further, the segment 302a closer to the light source 212 may be a hyperboloid mirror, while a segment 302b further from the light source 212 may be an ellipsoid mirror to focus the rays 306 at the focal point 308. It is understood however, that the shapes of the mirrors, the number of mirrors, and the position of the mirrors may be changed as necessary for specific applications.

Varying the distance D 302 between the light source 212 and mirrors 302 may potentially result in apodization. Apodization is a condition where a diffraction pattern generated by the mirrors is modified from the intended pattern. If apodization becomes a problem with embodiments of the invention, the inner mirrors nearer to the optic access can be made rougher than the outer mirrors. This alters the reflectively of the mirrors, changing the amount of light that each set mirrors transmits. The roughness of the mirrors may be changed by polishing the mirrors or through other known techniques. Rougher mirrors have a lower reflectivity, and as a result transmit less light.

By having the outer mirrors, which may not receive as much light as the outer mirror, transmit more light by reducing the reflectivity of the inner mirrors, a more uniform light may be focused and the focal point 306, thereby reducing the effects of apodization. However, in many applications, apodization may not be a problem because of the small relative range of partial coherences that are typically used for photolithography.

Figure 5:
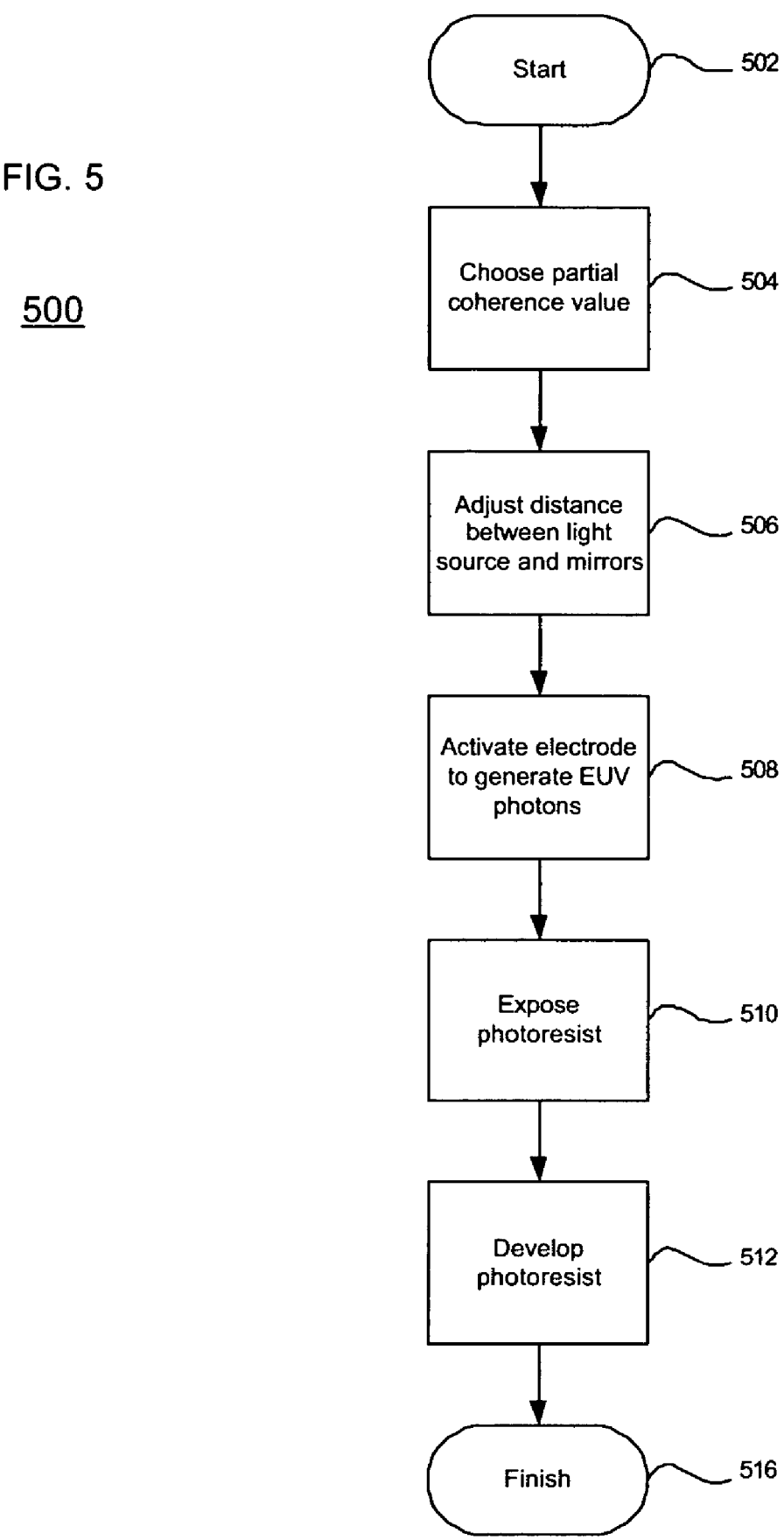
FIG. 5 is a flowchart illustrating a process for adjusting partial coherence values using EUV optics, according to embodiments to the invention.

FIG. 5 is a flowchart illustrating a process for adjusting partial coherence values using EUV optics according to embodiments to the invention. The process 500 begins in start block 502. In block 504, a partial coherence value appropriate for the type of feature the user wishes to print in chosen. As mentioned above, higher partial coherence values are typically used for densely packed features, while lower coherence values are used for isolated features. On any given semiconductor substrate, a user may need to include several different types of features having a range of different sizes and different densities. Therefore, the user can use embodiments of this invention to make multiple passes over the same area changing the partial coherences of the optics between making those passes.

In block 506, the distance between the light source and the mirrors is adjusted to change the partial coherence of the illumination optics. For example, the pushing jig described above may be used to move the electrode toward and away from the focusing mirrors. The distance may be chosen based on the partial coherence value chosen in block 504. The process for determining the distance based on the desired partial coherence value was explained above.

In block 508, the electrode or other light source is activated to generate EUV photons. The EUV photons are reflected off of the reflecting mirrors described above, and eventually encounter a reticle, which masks a pattern of light to expose a layer of photoresist. In block 510, the photoresist is exposed, and in block 512 the photoresist is developed to expose the underlining portions of the semiconductor substrate that the user wishes to modify. The user may then perform other semiconductor processing techniques such as ion implantation or etching. In block 514, the process is finished and the user may begin again and choose a new partial coherence value for another range of features to be printed on the semiconductor substrate.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are accordingly to be regarded in an illustrative, rather than in a restrictive sense.

What is claimed is:

1. An adjustable illumination source comprising:
    a light source;
    a set of mirrors to focus light generated by the light source onto a layer of photoresist;
    a housing connected to the light source, the housing is adjustable to adjust the position of the light source relative to the set of mirrors to adjust a partial coherence value for light emitted by the light source.

2. The adjustable illumination source of claim 1, wherein the light source comprises a source plasma to generate extreme ultraviolet (EUV) photons.

3. The adjustable illumination source of claim 2, wherein the light source comprises an electrode to excite a plasma connected to the housing.

4. The adjustable illumination source of claim 3, wherein the electrode comprises an anode isolated from a cathode, and wherein the anode is connected to the housing.

5. The adjustable illumination source of claim 3, wherein the plasma is chosen from the group consisting of xenon, lithium, and tin.

6. The adjustable illumination source of claim 1, wherein the housing comprises bellows and a pushing jig connected to the light source.

7. The adjustable illumination source of claim 6, wherein the bellows produces a spring pressure to hold the light source against the pushing jig.

8. The adjustable illumination source of claim 1, further comprising:
a reticle to mask the light before it exposes the photoresist; and
a condenser to collimate the light and to shape the light.

9. An adjustable illumination source comprising:
an electrode including a cathode and an anode having a plasma disposed in between the cathode and the anode to generate photons when the electrode is activated;
a set of mirrors to focus the photons onto a layer of photoresist; and
a housing connected to the electrode through bellows, the bellows allows the electrode to move in relation to the set of mirrors to alter a partial coherence value of light reflected by the mirrors.

10. The adjustable illumination source of claim 9, further comprising:
a reticle to receive the light and to mask the light before it is transmitted to the layer of photoresist.

11. The adjustable illumination source of claim 9, further comprising:
a pushing jig connected to the housing and the electrode to adjust a position of the electrode relative to the set of mirrors.

12. The adjustable illumination source of claim 11, wherein the bellows generate a spring pressure against the electrode.

13. The adjustable illumination source of claim 9, wherein the electrode generates extreme ultraviolet (EUV) photons.

14. The adjustable illumination source of claim 9, wherein the set of mirrors comprises a set of hyperboloid mirrors and a set of ellipsoid mirrors.

15. A method for adjusting a light source comprising:
determining a partial coherence value for a photolithographic process;
determining a distance between the light source and a set of mirrors that results in the partial coherence value;
adjusting the light source relative to the mirrors so that it is positioned at the distance from the optics; and
activating the light source to expose a layer of photoresist.

16. The method of claim 15, wherein adjusting the light source comprises:
moving the light source toward or away from the set of mirrors on an adjustable housing.

17. The method of claim 15, wherein the light source is an extreme ultraviolet (EUV) light source.

18. The method of claim 17, wherein the EUV light source comprises an electrode.

19. The method of claim 15, wherein activating the light source comprises activating an electrode to excite a plasma to generate EUV photons.

20. The method of claim 15, wherein determining a distance comprises:
determining the partial coherence based on a ratio of an object side numerical aperture and an image side numerical aperture;
determining a magnification of the set of mirrors based on the object side numerical aperture; and
determining the distance based on the magnification.

* * * * *